(12) United States Patent
Yokoyama

(10) Patent No.: US 6,281,634 B1
(45) Date of Patent: Aug. 28, 2001

(54) COLOR ELECTROLUMINESCENCE DISPLAY DEVICE

(75) Inventor: Ryoichi Yokoyama, Ohgaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/451,452

(22) Filed: Nov. 30, 1999

(30) Foreign Application Priority Data

| Dec. 1, 1998 | (JP) | ................................................. 10-341860 |
| Oct. 4, 1999 | (JP) | ................................................. 11-283177 |

(51) Int. Cl.$^7$ ..................................................... G09G 3/10
(52) U.S. Cl. ..................... 315/169.3; 313/506; 345/45; 345/76
(58) Field of Search ............................. 315/169.3, 169.1; 313/483, 494, 503, 505, 506; 345/44, 45, 55, 76

(56) References Cited

U.S. PATENT DOCUMENTS

| 5,384,517 | * | 1/1995 | Uno ..................................... 315/169.3 |
| 5,399,936 | * | 3/1995 | Namiki et al. ........................ 313/504 |
| 5,550,066 |   | 8/1996 | Tang et al. ............................... 437/40 |
| 5,670,792 |   | 9/1997 | Utsugi et al. .......................... 313/505 |
| 5,684,365 |   | 11/1997 | Tang et al. .......................... 315/169.3 |
| 5,747,930 |   | 5/1998 | Utsugi .................................. 313/504 |
| 5,838,289 | * | 11/1998 | Saito et al. ............................... 345/76 |
| 5,852,481 | * | 12/1998 | Hwang ..................................... 349/43 |
| 5,897,328 | * | 4/1999 | Yamauchi et al. ...................... 438/29 |
| 5,920,080 | * | 7/1999 | Jones ..................................... 313/509 |
| 5,966,189 |   | 10/1999 | Matsuo ................................... 349/38 |
| 6,010,796 | * | 1/2000 | Kijima ................................. 313/506 |
| 6,147,451 |   | 11/2000 | Shibata et al. ........................ 313/506 |

FOREIGN PATENT DOCUMENTS

| 0717445A2 | 6/1996 | (EP) | ............................. H01L/27/15 |

* cited by examiner

*Primary Examiner*—Don Wong
*Assistant Examiner*—Thuy Vinh Tran
(74) *Attorney, Agent, or Firm*—Cantor Colburn LLP

(57) ABSTRACT

Discrete anodes (7) and discrete emissive layers (15) are formed for respective pixels, while a hole-transport layer (14), an electron-transport layer (16), and a cathode (17) are formed to extend over a plurality of pixels. Accordingly, a process of etching-back the hole-transport layer (14) and the electron-transport layer (16) is eliminated. Also, since partitions (68) as conventionally provided are not necessary, the process of forming the partitions can also be eliminated. The anode (7) and the cathode (17) are separated by the hole-transport layer (14) and the electron-transport layer (16), and are therefore not subject to shorting, even though no partition (68) is employed. Further, since the emissive layer (15) is larger than the anode (7), a leak current generated at the ends of the anode and field concentration can be prevented.

21 Claims, 10 Drawing Sheets

Fig. 6A
| R | G | B | R | G | B | R | G | B |
|---|---|---|---|---|---|---|---|---|
| R | G | B | R | G | B | R | G | B |
| R | G | B | R | G | B | R | G | B |
| R | G | B | R | G | B | R | G | B |
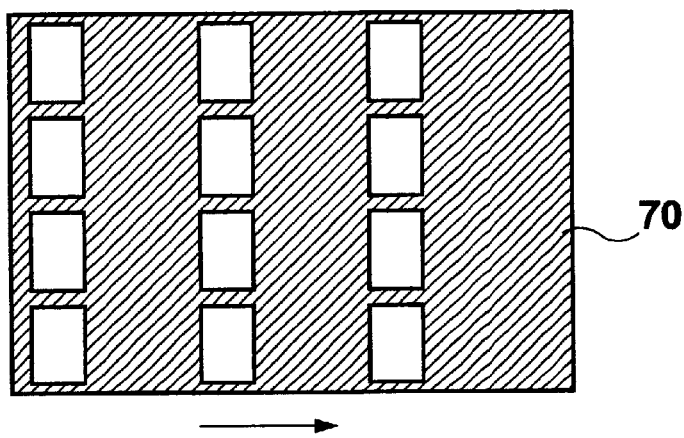
Fig. 6B
Fig. 6C
| R | G | B | R | G | B | R | G | B |
|---|---|---|---|---|---|---|---|---|
| G | B | R | G | B | R | G | B | R | G |
| R | G | B | R | G | B | R | G | B |
| G | B | R | G | B | R | G | B | R | G |
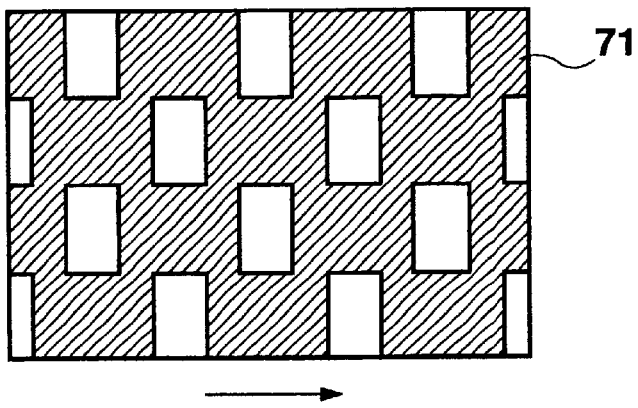
Fig. 6D

COLOR ELECTROLUMINESCENCE DISPLAY DEVICE

BACKGROUND OF THE INVENTION

1. Field of the Invention

The present invention relates to an active type color EL (electroluminescence) display device in which an electroluminescence (EL) element is driven using a thin film transistor (TFT).

2. Description of Related Art

Practical use of organic EL elements in next generation display devices is greatly expected, because such displays can eliminate need for a back light as required in a liquid crystal display device for self-emission, can be optimally made thin, and can have an unlimited viewing angle.

Three methods have commonly been proposed for achieving color display in a display device comprising such an organic EL element.

In the first method, different emissive materials for each of the primary RGB colors are used in corresponding emissive layers to individually form discrete color pixels directly emitting respective RGB light rays. In another method, an emissive layer generates white luminescence which is then converted into three primary colors using color filters. A third method is based on conversion of light from a blue emissive layer into three primary colors using color conversion mediums (CCM). As light energy is lost in the second and third methods above due to the use of color filters or color conversion mediums, the first method is the most effective of these in this respect because a desired light ray is directly emitted.

Meanwhile, to drive an organic EL display device, two types of driving methods, a passive type using a passive matrix and an active type employing TFTs, are available. The circuit configuration shown in FIG. 1 may be used in an active display.

FIG. 1 illustrates a circuit configuration for a single pixel in such a display pixel. Each pixel comprises an organic EL element 20, a first TFT 21 for switching, in which a display signal DATA is applied to a drain and a scan signal SCAN is applied to a gate to switch the TFT on and off, a capacitor 22 which is charged by a display signal DATA applied when the TFT 21 is on and which holds a charge voltage Vh when the TFT 21 is off, a second TFT 23 in which a drain is connected to a drive source of a voltage $V_{COM}$, a source is connected to an anode of the organic EL element 20 and a hold voltage Vh is applied to a gate from the capacitor 22 to drive the organic EL element 20.

A scan signal SCAN rises to an H level during one horizontal scanning period (1H). When the TFT 21 is switched on, a display signal DATA is applied to one end of the capacitor 22, which is then charged by a voltage Vh corresponding to the display signal DATA. This voltage Vh remains held in the capacitor 22 for one vertical scanning period (1V) even after the signal SCAN becomes a low level to switch the TFT 21 off. Because the voltage Vh is supplied to the gate of the TFT 23, the EL element is controlled so as to emit light with a luminance in accordance with the voltage vh.

The conventional configuration of such an active type EL display device for achieving color display by means of the above-mentioned first method will be now described.

FIG. 2 depicts a conceptual plan view showing a configuration of a related art device, and FIG. 3 is a cross section taken along line C—C in FIG. 2. Each of the drawings depicts three pixels.

In FIGS. 2 and 3, numeral 50 represents a drain line for supplying a display signal DATA, numeral 51 represents a drive source line for supplying a supply voltage $V_{COM}$, and numeral 52 represents a gate line for supplying a scan signal SCAN. Further, numerals 53, 54, and 55 designate features corresponding the first TFT 21, the capacitor 22, and the second TFT 23 in FIG. 1, respectively, and numeral 56 designates an anode of the EL element 20 which constitutes a pixel electrode. As shown, discrete anodes 56 are separately formed for each pixel on a planarization insulating film 60. A hole-transport layer 61, an emissive layer 62, an electron-transport layer 63, and a cathode 64 are sequentially laminated on the discrete anode 56, thereby forming an EL element. Holes injected from the anodes 56 and electrons injected from the cathodes 64 are recombined inside the emissive layer 62, which emits light in the direction of the transparent anodes toward outside, as shown by arrows in FIG. 3. Here, discrete hole-transport layers 61, discrete emissive layers 62 and discrete electron-transport layers 63 having substantially the same shape as the discrete anodes 56 are provided for respective pixels. Emissive materials which are different for each RGB are used in the corresponding emissive layers 62, and therefore light rays having respective RGB colors are emitted from respective EL elements. The cathode 64, which applies a common voltage to each pixel, extends over the pixels. Partitions 68 are interposed between adjoining emissive layers 62. Further, numerals 65, 66, and 67 designate a transparent glass substrate, a gate insulating film, and an interlayer insulating film, respectively.

In a color EL display device as described above, however, especially in the case where different emissive materials of the emissive layer are used for each of three RGB colors, an increased number of manufacturing processes is expected such as forming a discrete hole-transport layer 61, a discrete emissive layer 62, and a discrete electron-transport layer 63 for each pixel, followed by forming partitions 68 and finally forming the cathode 64. There has therefore been a demand for a color EL display device with a simpler configuration.

SUMMARY OF THE INVENTION

The present invention is directed to providing an EL display device that can be manufactured through simple processes.

In an EL display device in accordance with the present invention, a charge-transport layer, for example, a hole-transport and/or an electron-transport layer, and a second electrode (e.g. a cathode) are formed over a plurality of pixels, thereby reducing the number of manufacturing processes. Further, the charge-transport layer is necessarily disposed between a first electrode and a second electrode, a short between both electrodes can be prevented without providing any extra partitions or the like.

Further, emissive materials which are different for each of red, green and blue colors are used for the emissive layers, whereby each electroluminescence element directly emits any one of RGB colors. According to the present invention, it is possible to manufacture such a color EL display device having emissive materials which are different for each pixel, with a reduced number of processes.

It is preferable that a first electrode (e.g. an anode) and an emissive layer have substantially the same planar shape. This minimizes the region for forming the emissive layer, prevents mixture of the emissive layers in adjoining pixels, and increases color purity.

It is also preferable that the emissive layer is larger than the anode such that the emissive layer covers the edges of the anode. This allows the emissive layer to be infallibly positioned over the first electrode even when an error is caused in forming the emissive layer. As a result, a leak current generated at the edges of the first electrode and a false field concentration can be prevented.

Further, in the present invention, the above-mentioned switch can be formed as a thin film transistor. The active type EL display transistor using such a thin film transistor allows accurate control of luminescence at each EL element, thereby achieving display of high quality.

In the present invention, the charge-transport layer has higher resistance than the first and the second electrode. By interposing such transport layers having higher resistance between the first and the second electrode, electrical separation of both electrodes can be ensured.

BRIEF DESCRIPTION OF THE DRAWINGS

These and other objects of the invention will be explained in the description below, in connection with the accompanying drawings, in which:

FIGS. 6A, 6B, 6C and 6D are views for explaining color sequences used in a color EL display device;

DETAILED DESCRIPTION OF THE PREFERRED EMBODIMENTS

Preferred embodiments of the present invention will be described in further detail with reference to the accompanying drawings.

Figure 4:
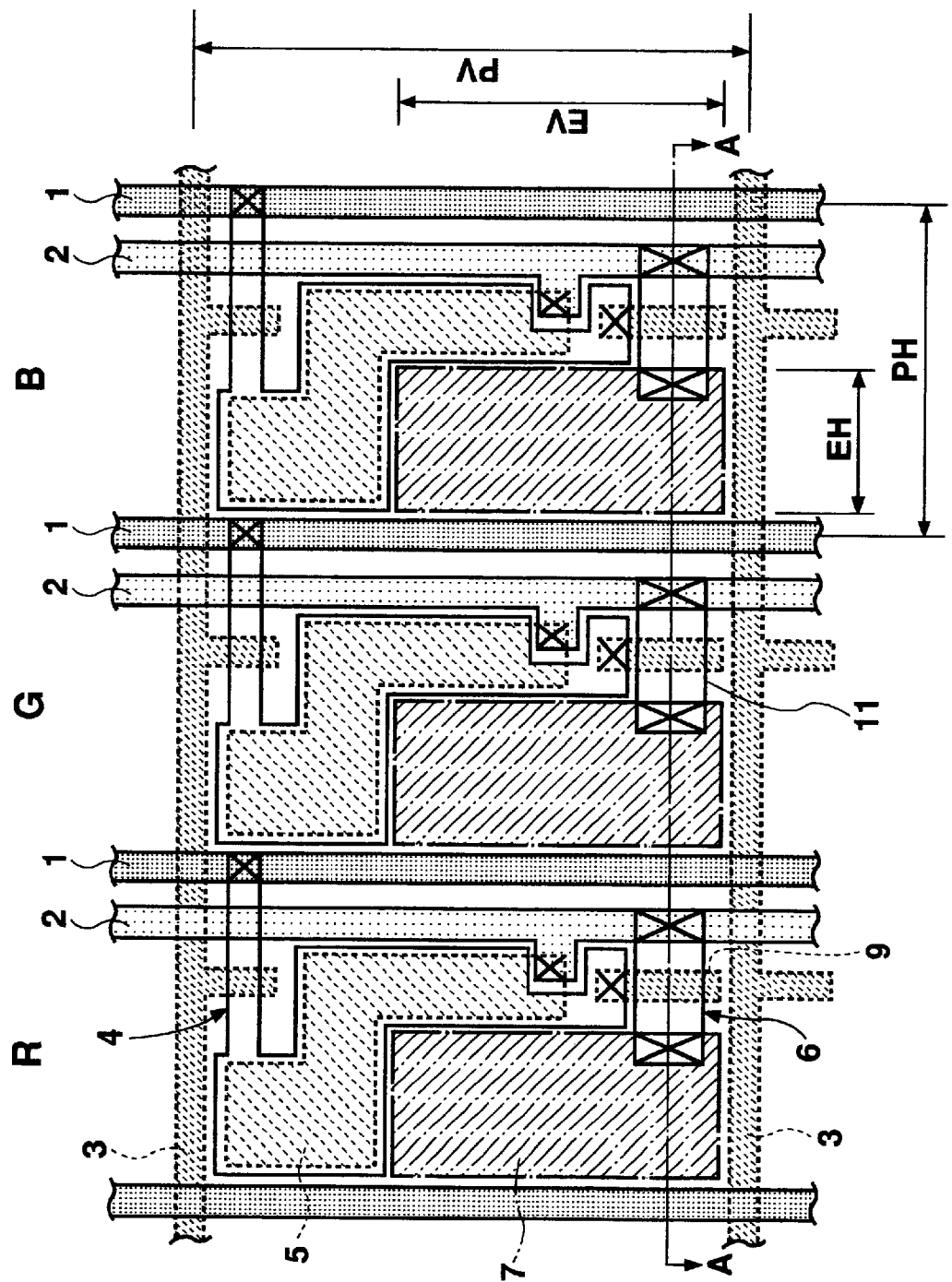
FIG. 4 is a plan view illustrating a first embodiment of the present invention.
Figure 5:
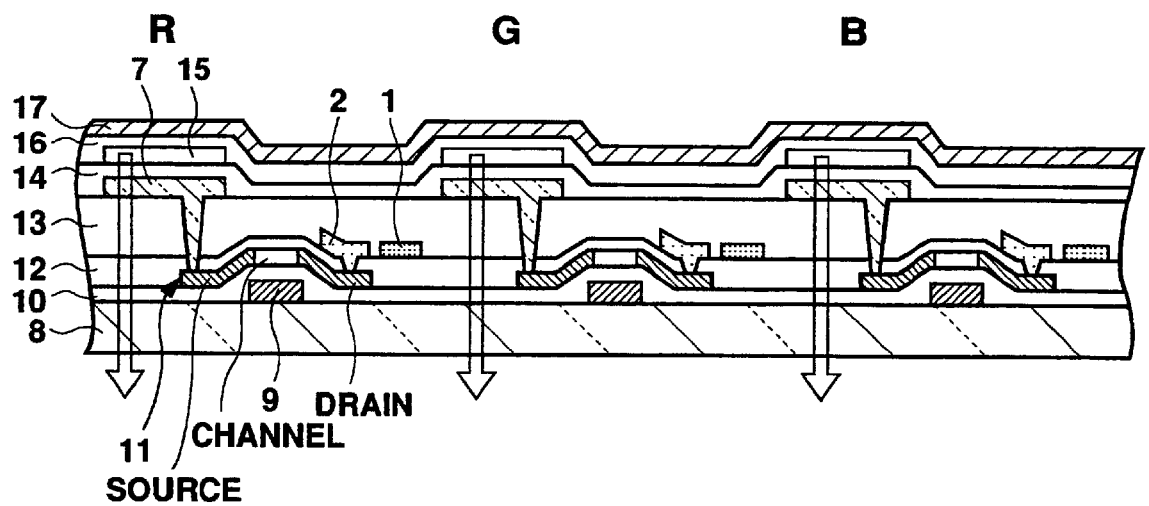
FIG. 5 is a cross section illustrating the first embodiment of the present invention.

Referring to FIG. 4, there is depicted in plan view a color EL display device according to one embodiment of the present invention. It should be noted in FIG. 4 that, for simplicity of explanation and ease of understanding, an organic layer and a cathode of an organic EL element are not shown and a basic configuration corresponding to three RGB pixels is shown. FIG. 5 is a cross section taken along a line A—A in FIG. 4. This embodiment will exemplify the configuration in which RGB pixels for color display are arranged in a stripe arrangement as shown in FIG. 6A.

Figure 1:
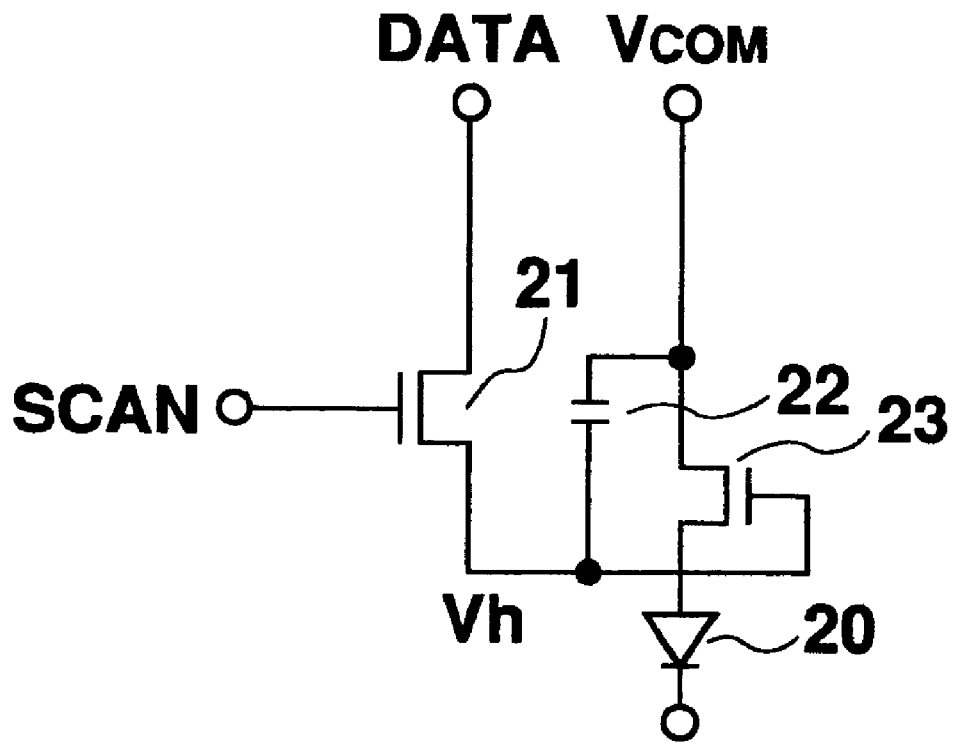
FIG. 1 is a view showing a circuit configuration of an active type color EL display device.
Figure 2:
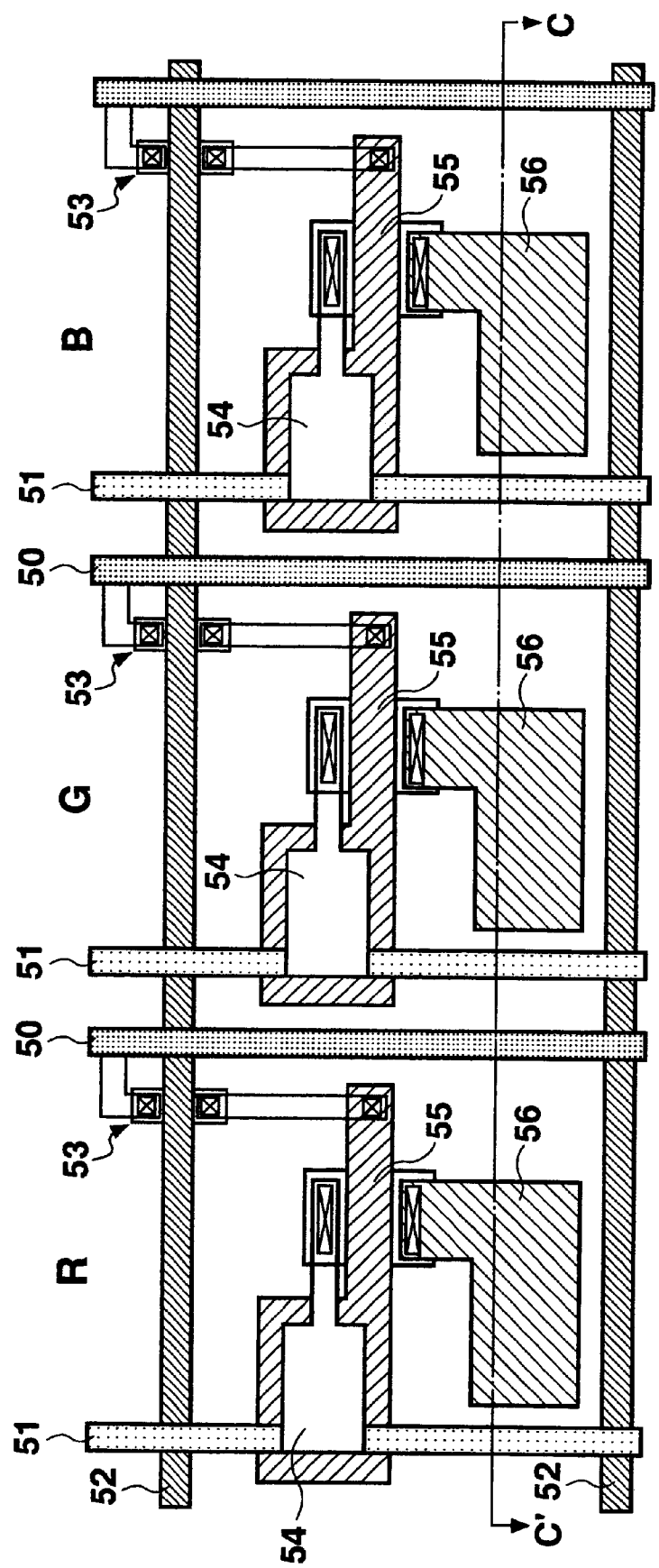
FIG. 2 is a plan view showing a configuration of a conventional color EL display device.
Figure 3:
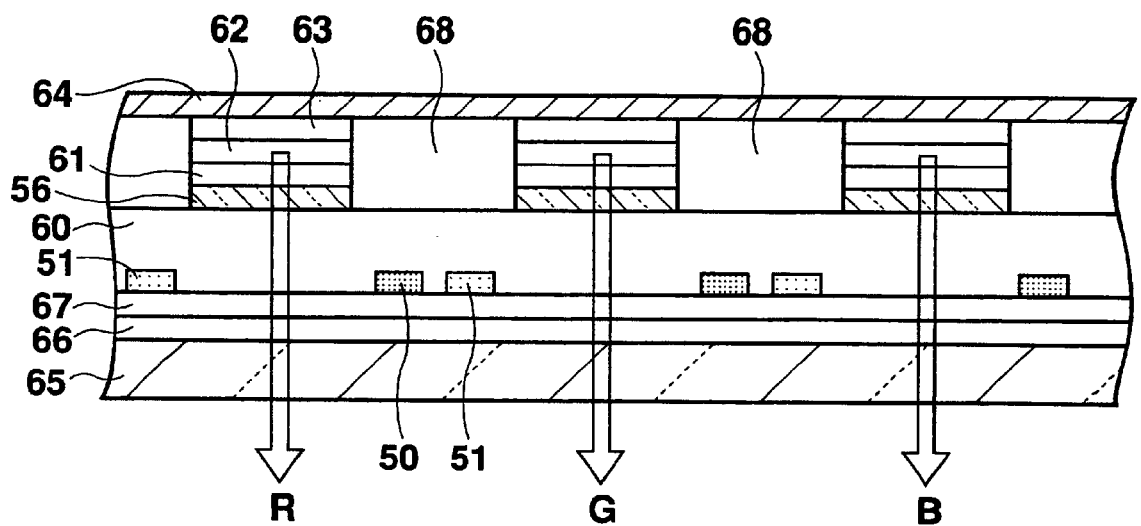
FIG. 3 is cross section showing a configuration of a conventional color EL display device.

A driving circuit for each pixel in this embodiment is the same as that in FIG. 1, and the configuration of the device differs from the example shown in FIGS. 2 and 3 in the pattern arrangement and the cross section.

Referring to FIGS. 4 and 5, the device comprises a data line 1 made of aluminum for supplying a display signal DATA, a power supply line 2 made of aluminum for supplying a power from a drive source COM, and a gate line made of chrome for supplying a scan signal SCAN. Each pixel of the EL display further comprises a first TFT 4 corresponding to the first TFT 21 in FIG. 1, a capacitor 5 corresponding to the capacitor 22 in FIG. 1, a second TFT 6 corresponding to the second TFT 23 in FIG. 1, and an anode (a first electrode) 7 of the EL element 20 comprising ITO and constituting an pixel electrode. In FIG. 4, regions enclosed by dot lines are formed by chromium, regions enclosed by chain lines are formed by ITO, and regions enclosed by solid lines other than the data line 1 and the power supply line 2 are formed using a polysilicon thin film.

The second TFT 6 is formed as follows. First, a gate electrode 9 is formed on a transparent glass substrate 8, and a gate insulating film 10 is formed thereupon. Then, a polysilicon thin film 11 formed on the gate insulating film 10 is covered with an interlayer insulating film 12, on which the data line 1 and the power supply line 2 are formed. A planarization insulating film 13 is further formed thereon and the anode 7 comprising ITO is finally formed on the planarization insulating film 13. Then, the drain region of the polysilicon thin film 11 is brought into contact with the power supply line 2 while the source region of the polysilicon thin film 11 is brought into contact with the anode 7.

The configuration of the first TFT 4 is substantially the same as that of the second TFT 6, with the notable exception that the drain region of the first TFT 4 is connected to the data line 1, and not to the power supply line 2. Further, the capacitor 5 connected to the first TFT 4 comprises a chromium electrode and a polysilicon thin film having a gate insulating film interposed therebetween.

The discrete anodes 7 are formed on the planarization insulating film 13 corresponding to respective pixels, and a hole-transport layer 14 is formed thereon so as to cover the entire pixels. Then, discrete emissive layers 15 are formed for each pixel, on which an electron-transport layer 16 and a cathode 17 are laminated in this order to complete formation of an EL element. Holes injected from the anode 7 and electrons injected from the cathode 17 are recombined inside the emissive layer 15, which emits light in the direction of the transparent anode toward outside, as indicated by arrows in FIG. 5. The discrete emissive layers 15 are formed for respective pixels to have substantially the same shape as the discrete anodes 7, and different emissive materials are used for each of the RGB colors. Thus, each EL element emits one type of RGB light.

Materials of, for example, MTDATA, $Alq_3$, and MgIn alloy may be used for the hole-transport layer 14, the electron-transport layer 16, and the cathode 17, respectively. Further, for example, Alq containing DCM type as dopant is used for the emissive layer 15 for R, Alq containing quinacridon as dopant is used for the emissive layer 15 for G, and DPVBi containing distyrylarylene or Perylene as dopant is used in the emissive layer 15 for B.

In this embodiment, as shown in FIG. 4, the second TFT 6 and part of the capacitor 5 are disposed in the horizontal direction with regard to the panel of the anode 7 which constitutes a pixel electrode, in other words, between the anode 7 of one pixel and another pixel, in particular the anode thereof, which adjoins in the horizontal direction and emits a color different from the one pixel. This configuration allows the pixel electrode to extend further in the vertical direction compared to the related art example shown in FIGS. 2 and 3. Further, the luminescent region of a pixel has substantially the same shape as the pixel electrode since the pixel electrode 7 and the emissive layer 15 have substantially the same shape. Accordingly, assuming that the dimensions of the luminescent region in the horizontal and vertical direction are EH and EV, respectively, and that the dimensions of the pixel pitch in the horizontal and vertical direction are PH and PV, respectively, EH/EV<PH/PV is found.

Thus, when forming respective RGB emissive layers by displacing metal masks for each RGB with one another in the horizontal direction with respect to the panel, as shown by an arrow in FIG. 6B, a room for such displacement of the metal masks in the horizontal direction is enlarged compared to the conventional configuration. As a result, the likelihood of colors in adjoining emissive layers being mixed can be reduced, even when emissive layers using different materials for each colors are formed with the same positioning accuracy as that in the related examples. Here, the first TFT 4, in place of the second TFT 6, may be disposed in the horizontal direction of the anode 7.

Further, the area for the emissive layer 15 can be minimized by forming the anode 7 and the emissive layer 15 to have substantially the same shape, as will be explained in the following. That is, the emissive layer 15 emits light when a current flows between the anode 7 and the cathode 17. Therefore, if the emissive layer 15 is formed over the region other than the anode, a current does not flow and the emissive layer 15 does not emit light, and therefore makes no significant contribution to display. Further, because the distance between the discrete emissive layers having different colors is reduced, the emissive layers 15 of different colors may be adversely mixed, thereby lowering the color purity. Accordingly, if the emissive layer 15 is minimized in size, the possibility that emissive layers of different colors will be mixed can be reduced while simultaneously sufficient display areas of the emissive layers 15 are secured.

The feature of the sectional configuration of this embodiment will be described with reference to FIG. 5. In this embodiment, the hole-transport layer 14 and the electron-transport layer 16 are formed to extend over respective pixels and the emissive layer 15 emits light by causing a current to flow therethrough. The discrete emissive layers 15, which must be formed to emit different color light for different pixels, are provided independently for each pixel. On the other hand, the difference in operation is not significant whether the hole-transport layer 14 and the electron-transport layer 16 are formed independently for each pixel or formed to extend over a plurality of pixels.

However, in the case where the hole-transport layer 14 and the electron-transport layer 16 are formed to extend over a plurality of pixels, the manufacturing processes can be simplified in the following manner. In order to form discrete hole-transport layers 14 and discrete electron-transport layers 16 for respective pixels, either one of the following methods must be adopted, namely a method of selectively forming these layers using metal masks including openings corresponding to the layer-forming regions or a method of forming the layer over the entire region which are then subjected to etching-back. In this embodiment, however, it is possible to simply form the hole-transport layer 14 over the entire surface including the surfaces of discrete anodes 7 formed for each pixel, form the discrete emissive layers 15 as described above, and then form the electron-transport layer 16 and the cathode thereon over the entire surface. In this manner, the process of etching-back the hole-transport layer 14 and the electron-transport layer 16, for example, can be eliminated. In particular, a method which requires no etching process is advantageous in implementing a device having high reliability, because currently used organic materials are not always preferable to the etching processes which are often employed, and therefore an organic layer subjected to etching often adversely effects to the life of the organic EL element.

Further, the partitions 68 for separating the pixels shown in FIG. 3 are not necessary in this embodiment. In the related examples, the partitions 68 are provided so as to achieve insulation between the anode 7 and the cathode 17 and to prevent mixture of the emissive layers 15 of different colors in adjoining pixels which causes reduction of color purity. In this embodiment, because the discrete emissive layers 15 and discrete anodes 7 provided for each pixel have substantially the same shape, the possibility of the emissive layers 15 mixing is reduced. Further, the hole-transport layer 14 and the electron-transport layer 16 both having higher resistance compared with the anode 7 and the cathode 17 are disposed between the anode 7 and the cathode 17, thereby preventing shorting therebetween. As a result, the partitions 68 are not necessary.

Figure 7:
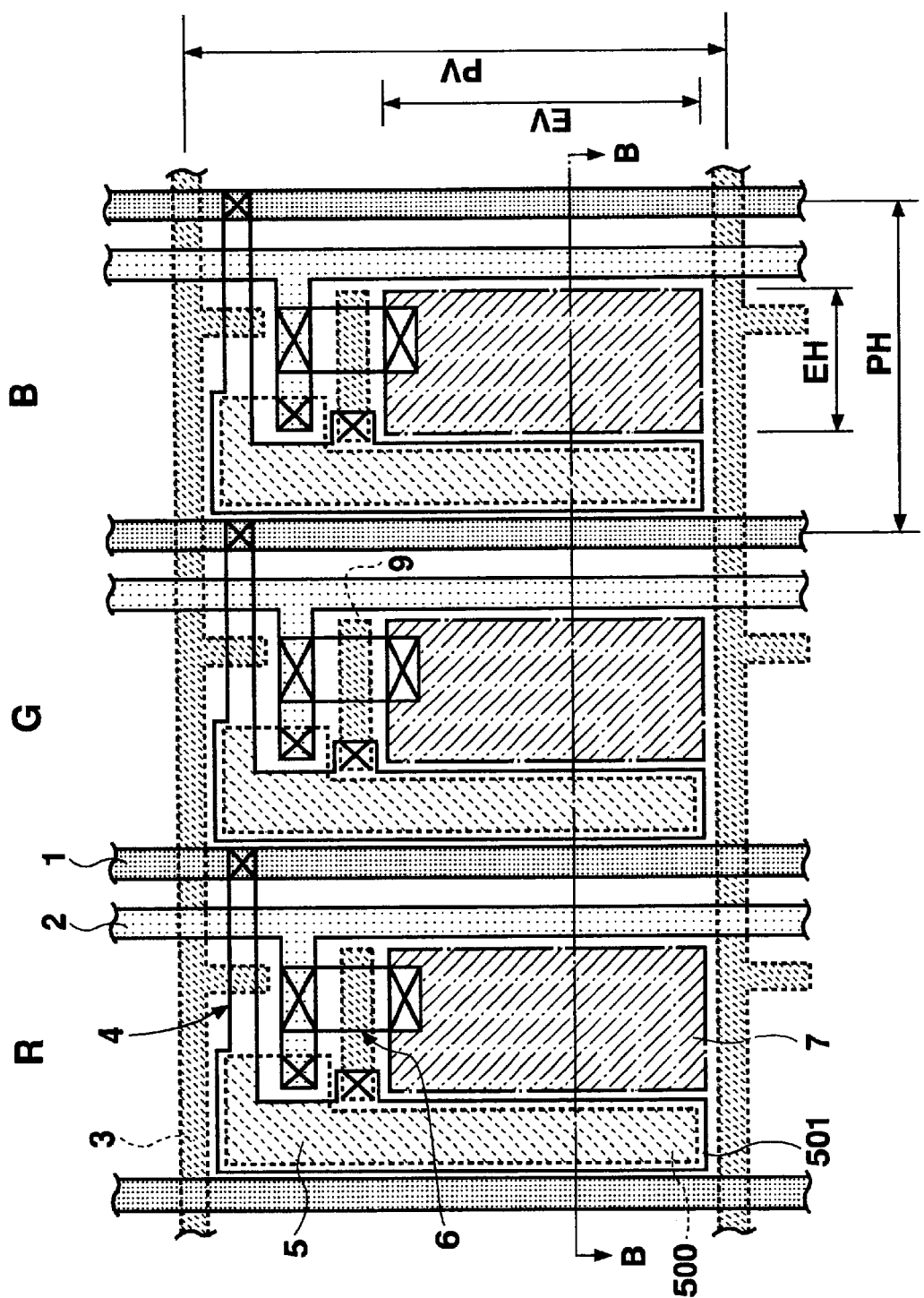
FIG. 7 is a plan view illustrating a second embodiment of the present invention.
Figure 8:
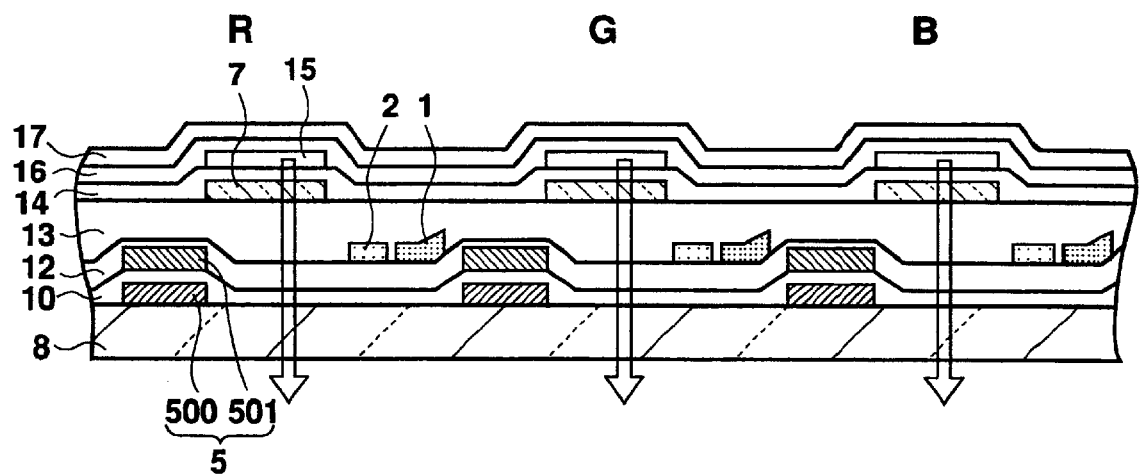
FIG. 8 is a cross section illustrating the second embodiment of the present invention.

Referring now to FIGS. 7 and 8, a second embodiment of the present invention will be described.

FIG. 7 depicts, in plan view, the second embodiment of the present invention, and FIG. 8 is a cross section taken along line B—B of FIG. 7. It is to be noted that in these drawings the same elements as shown in FIGS. 4 and 5 are designated by the same reference numerals, and that the second embodiment differs from the first embodiment only in the pattern arrangement. Further in FIG. 7, as in FIG. 4, the organic layer and the cathode are eliminated for simplicity of explanation and ease of understanding.

In FIGS. 7 and 8, numeral 4 denotes a first TFT corresponding to the first TFT 21 of FIG. 1, numeral 5 denotes a capacitor corresponding to the capacitor 22 of FIG. 1, numeral 6 denotes a second TFT corresponding the second TFT 23 of FIG. 1, and numeral 7 denotes an anode comprising ITO and constituting a pixel electrode of the EL element 20. As clearly shown in FIG. 8, the capacitor 5 is constituted by a chromium electrode 500 and a polysilicon thin film 501 having a gate insulating film 10 therebetween.

In this embodiment, as shown in FIG. 7, the capacitor 5 is disposed next to the anode 7 which constitutes a pixel electrode in the horizontal direction with respect to the panel. Namely, as in the first embodiment, the capacitor 5 is necessarily disposed between the anode 7 of one pixel and the anode of another pixel which adjoins in the horizontal direction and emits a color different from the one pixel. This configuration allows the pixel electrode to extend further in the vertical direction than in the related art example shown in FIGS. 2 and 3. Further, as in the foregoing embodiment, when the dimensions of the luminescent region in the horizontal and vertical directions are EH and EV, respectively, and the dimensions of the pixel pitch in the horizontal and vertical directions are PH and PV, respectively, the relationship EH/EV<PH/PV is found true.

Thus, when forming respective RGB emissive layers such that metal masks for each RGB are displaced with each other in the horizontal direction with respect to the panel, as shown by an arrow in FIG. 6B, a room for such displacement of the metal masks in the horizontal direction is enlarged compared to the conventional configuration. As a result, the possibility that colors in the adjoining emissive layers may be mixed can be diminished even when the respective emissive layers are formed with the same positioning accuracy as that in the related examples.

As in the foregoing embodiment, the hole-transport layer 14 and the electron-transport layer 16 are formed over the entire surface, while the discrete anodes 7 and the discrete emissive layers 15 are formed for respective pixels.

Figure 9:
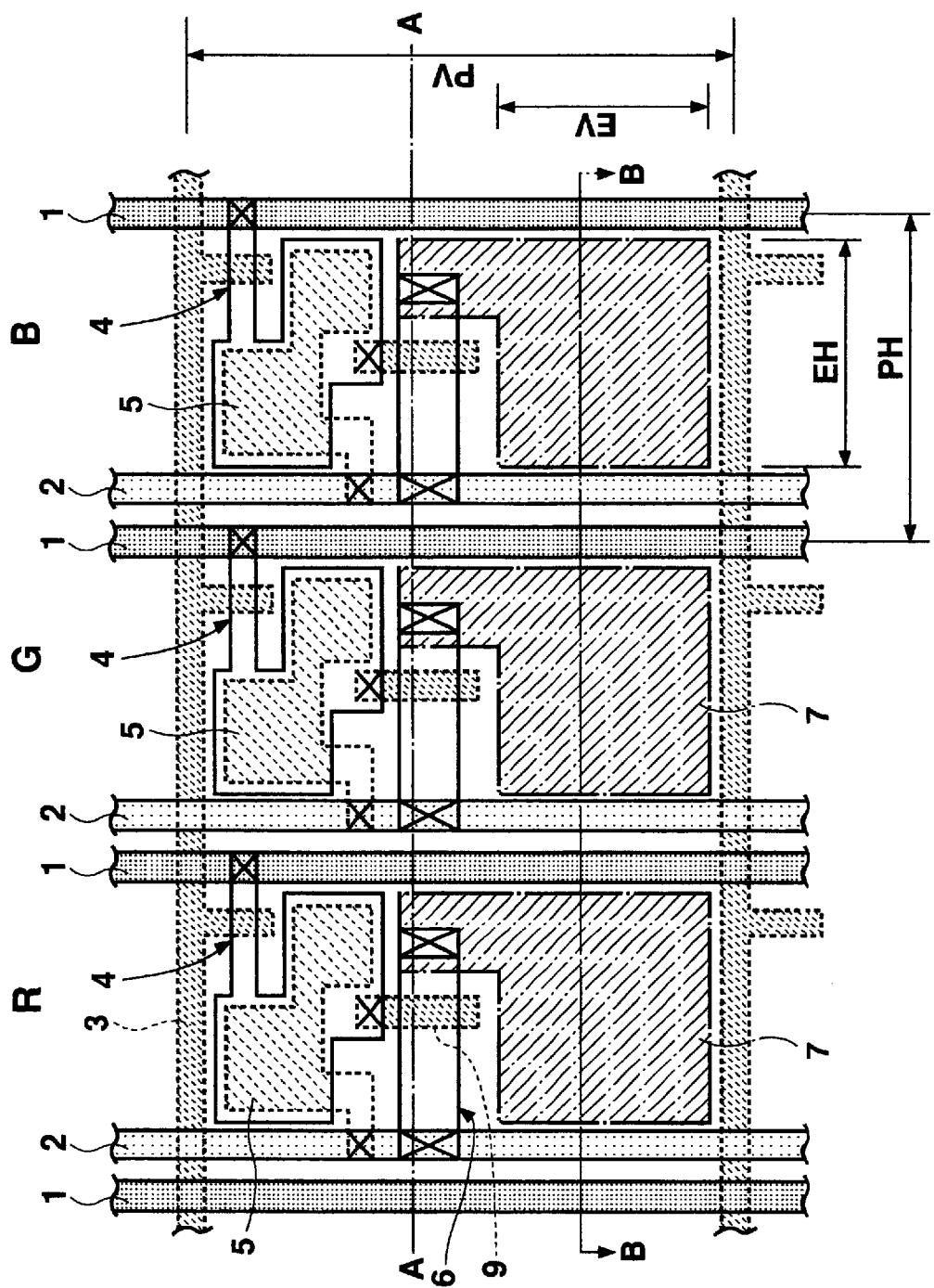
FIG. 9 is a plan view illustrating a third embodiment of the present invention.
Figure 10A:
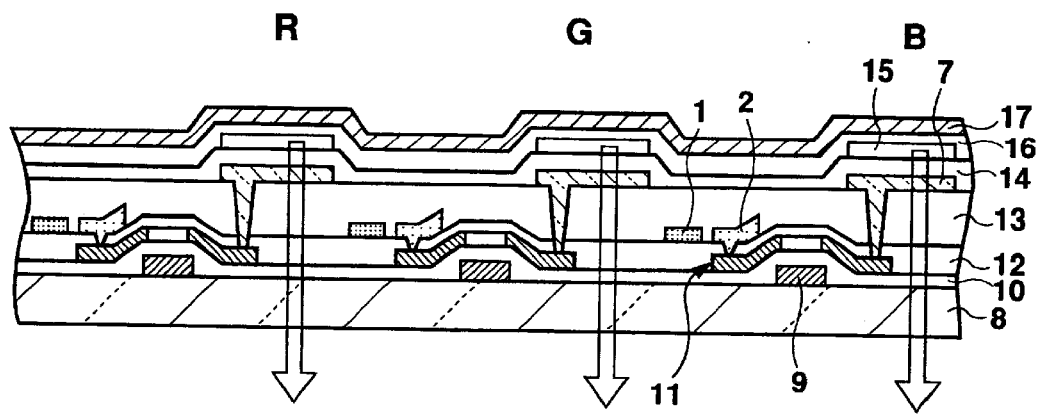
FIGS. 10A and 10B are cross sections illustrating the third embodiment of the present invention.
Figure 10B:
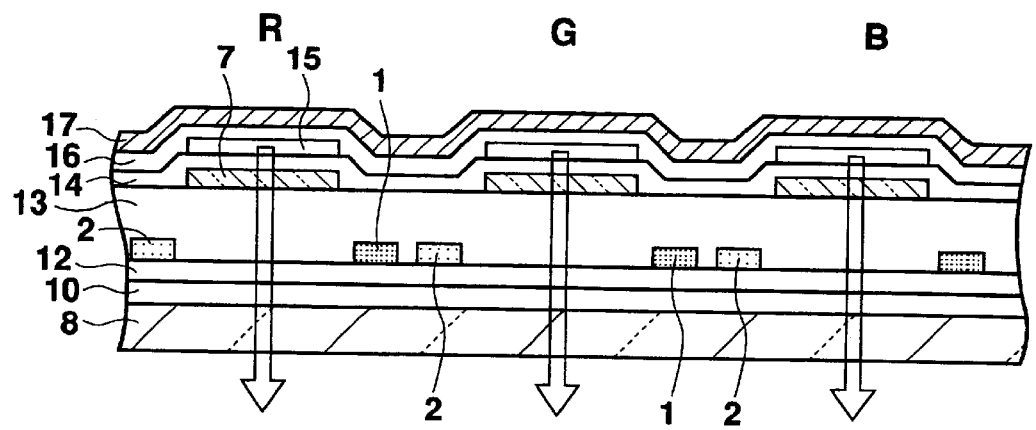

Referring further to FIGS. 9, 10A and 10B, a third embodiment of the present invention will be described.

FIG. 9 depicts, in plan view, the third embodiment of the present invention, FIG. 10A is a cross section taken along line A—A of FIG. 9, while Fig. 10B is a cross section taken along line B—B of FIG. 9. It is to be noted that in these drawings the same elements as shown in FIGS. 4 and 5 are designated by the same reference numerals, and that the third embodiment differs from the foregoing embodiments only in the pattern arrangement.

Specifically, in FIGS. 9, 10A and 10B, numeral 4 denotes a first TFT corresponding to the first TFT 21 of FIG. 1, numeral 5 denotes a capacitor corresponding to the capacitor 22 of FIG. 1, numeral 6 denotes a second TFT corresponding the second TFT 23 of FIG. 1, and numeral 7 denotes an anode comprising ITO and constituting a pixel electrode of the EL element 20.

In this embodiment, as shown in FIG. 9, the capacitor 5 is disposed next to the anode 7 constituting a pixel electrode in the vertical direction with respect to the panel, and this configuration is advantageous in the following manner. Specifically, in the case where RGB pixels are arranged such that pixels having different colors adjoin in the vertical direction as in the delta arrangement shown in FIG. 6C, additional space is provided in the vertical direction with respect to the panel. Such a delta pixel arrangement can be obtained by using panels for respective RGB colors as shown in FIG. 6C to form corresponding emissive layers 15. In this case, if there is an error in positioning these RGB masks in the upper and lower direction in FIG. 6D (the vertical direction with respect to the panel), mixture of RGB colors may occur. In this embodiment, however, since an enlarged room in the vertical direction of the panel is provided, the possibility that the colors will be adversely mixed is reduced, even when the emissive layers are formed with the same accuracy as in the conventional art.

As in the foregoing embodiments, the hole-transport layer 14 and the electron-transport layer 16 are formed over the entire surface whereas the discrete anodes 7 and the discrete emissive layers 15 are formed for each pixel.

Figure 11:
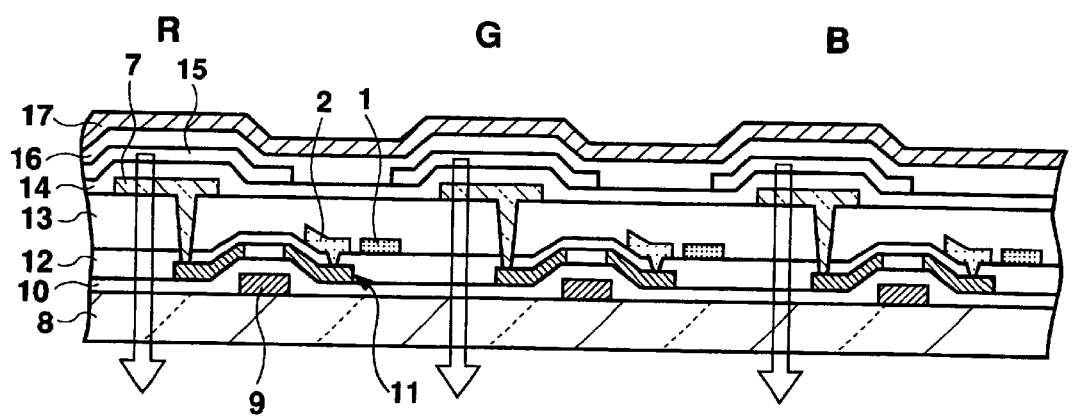
FIG. 11 is a cross section illustrating another version of each of the embodiments of the present invention.

Although the anode 7 and the emissive layer 15 are formed in completely identical patterns in the foregoing embodiments, it may be more preferable that the emissive layer 15 be formed so as to be larger than the anode 7 as shown in FIG. 11, for the following reasons. First, if the emissive layer 15 is larger than the anode 7, it is possible to extremely reliably dispose the emissive layer 15 over the anode 7, even when errors are generated in positioning the metal masks for forming the emissive layer 15. Further, there is a possibility that a leak current may be generated from the ends of the anode 7 or a false field concentration may be introduced, when the anode 7 and cathode 17 face each other without the emissive layer 15 interposing therebetween, since the hole-transport layer 14 and the electron-transport layer 16, though highly resistive, are not perfect insulating layers. Generation of such leak current or field concentration can be prevented by providing a larger emissive layer 15 so as to cover the ends of the anode. Since it is preferable to minimize the size of the emissive layer 15, the difference in size between the anode 7 and the emissive layer 15 must be optimally determined according to the positioning accuracy of the metal masks, the film thickness of the anode 7, or the like.

According to the present invention, because the hole-transport layer, the electron-transport layer, and the cathode are formed over a plurality of pixels, the number of manufacturing processes can be reduced. Further, the hole-transport layer and the electron-transport layer are necessarily disposed between the anode and the cathode, and a color EL display device having discrete anodes, discrete emissive layers, and discrete TFTs provided for respective pixels can be obtained.

Further, because substantially the same planar shape is employed for the anode and the emissive layer, the region for forming the emissive layers can be minimized. This leads to advantageous effects of preventing mixture of the emissive layers in adjoining pixels, thereby increasing color purity.

Also, because the emissive layer is larger than the anode so as to cover the ends of the anode, disposition of the emissive layer over the anode is ensured even when errors are generated when forming the emissive layer, and a leak current generated at the ends of the anode or adverse field concentration can be prevented.

Accordingly, with the above configurations, it is not necessary to provide a separate member, such as a partition, in the inter-pixel regions. As a result, an EL display device manufactured with even less effort can be obtained.

While the preferred embodiments of the present invention have been described using specific terms, such description is for illustrative purposes only, and it is to be understood that changes and variations may be made without departing from the spirit or scope of the appended claims.

What is claimed is:

1. An electroluminescence display device in which a plurality of pixels are arranged, each of said pixels comprising:

an electroluminescence element including an emissive layer and at least one charge-transport layer which transports charges from a first or a second electrode between said first electrode and said second electrode; and a switch for controlling luminescence operation in said electroluminescence element, wherein both of said first electrode and said emissive layer are formed for each of said pixels, and both of said second electrode and said charge-transport layer are formed to be shared by a plurality of pixels.

2. An electroluminescence display device according to claim 1, wherein said charge-transport layer is a hole-transport layer which transports holes supplied from an anode to said emissive layer.

3. An electroluminescence display device according to claim 2, wherein said first electrode is said anode, and wherein said anode, said hole-transport layer and said emissive layer are formed in this order.

4. An electroluminescence display device according to claim 1, wherein said charge-transport layer is an electron-transport layer which transports electrons supplied from a cathode to said emissive layer.

5. An electroluminescence display device according to claim 4, wherein said second electrode is said cathode, and wherein said cathode, said electron-transport layer and said emissive layer are formed in this order.

6. An electroluminescence display device according to claim 1, wherein said emissive layer contains an emissive material for one of red, green and blue colors, and wherein each electroluminescence element directly emits one of said colors.

7. An electroluminescence display device according to claim 1,
wherein said first electrode and said emissive layer have substantially the same planar shape.

8. An electroluminescence display device according to claim 1,
wherein said emissive layer is formed larger than said first electrode so as to cover the edges of said first electrode.

9. An electroluminescence display device according to claim 1,
wherein said switch is a thin film transistor.

10. An electroluminescence display device according to claim 1,
wherein said charge-transport layer has a higher resistance compared to said first electrode and said second electrode.

11. An electroluminescence display device in which a plurality of pixels are arranged,
each of said pixels comprising:
an electroluminescence element including an emissive layer and at least one charge-transport layer which transports charges from a first or a second electrode between said first electrode and said second electrode; and
a switch for controlling luminescence operation in said electroluminescence element,
wherein both of said first electrode and said emissive layer are formed for each of said pixels, said emissive layer contains an emissive material for one of red, green and blue colors, and each electroluminescence element directly emits one of said colors, and
wherein said second electrode, and said change-transport layer having a higher resistance compared to said second electrode and said first electrode, are formed so as to be shared by a plurality of pixels.

12. An electroluminescence display device according to claim 11,
wherein said charge-transport layer is a hole-transport layer which transports holes supplied from an anode to said emissive layer.

13. An electroluminescence display device according to claim 12,
wherein said first electrode is said anode, and wherein said anode, said hole-transport layer and said emissive layer are formed in this order.

14. An electroluminescence display device according to claim 11,
wherein said charge-transport layer is an electron-transport layer which transports electrons supplied from a cathode to said emissive layer.

15. An electroluminescence display device according to claim 14,
wherein said second electrode is said cathode, and wherein said cathode, said electron-transport layer and said emissive layer are formed in this order.

16. An electroluminescence display device in which a plurality of pixels are arranged,
each of said pixels comprising:
an anode,
a cathode, and
an electroluminescence element layer, provided between said anode and said cathode, including an emissive layer and a hole-transport layer which transports holes supplied from said anode to said emissive layer and an electron-transport layer which transports electrons supplied from said cathode to said emissive layer,
wherein said anode and said emissive layer are formed for each of the pixels, and
wherein said cathode and said hole-transport layer and said electron-transport layer are formed to be shared by a plurality of pixels.

17. An electroluminescence display device according to claim 16,
wherein said emissive layer contains an emissive material for one of red, green and blue colors, and each electroluminescence element directly emits one of said colors.

18. An electroluminescence display device according to claim 16,
wherein said anode and said emissive layer have substantially the same planar shape.

19. An electroluminescence display device in which a plurality of pixels are arranged,
each of said pixels comprising:
an electroluminescence element including an emissive layer and at least one charge-transport layer which transports charges from a first or a second electrode between said first electrode and said second electrode; and
a switch for controlling luminescence operation in said electroluminescence element,
wherein both of said first electrode and said emissive layer are formed for each of said pixels, and both of said second electrode and said charge-transport layer are formed to be shared by a plurality of pixels, and
wherein said first electrode is said anode, and wherein said anode, said charge-transport layer and said emissive layer are formed in this order.

20. An electroluminescence display device in which a plurality of pixels are arranged,
each of said pixels comprising:
an electroluminescence element including an emissive layer and at least one charge-transport layer which transports charges from a first or a second electrode between said first electrode and said second electrode; and
a switch for controlling luminescence operation in said electroluminescence element,
wherein both of said first electrode and said emissive layer are formed for each of said pixels, and both of said second electrode and said charge-transport layer are formed to be shared by a plurality of pixels, and
wherein said first electrode is said anode, and wherein said anode, said charge-transport layer and said emissive layer are formed in this order, and
wherein said emissive layers of adjacent pixels do not contact one another.

21. An electroluminescence display device in which a plurality of pixels are arranged, each of said pixels comprising:

an electroluminescence element including an emissive layer and at least one charge-transport layer which transports charges from a first or a second electrode between said first electrode and said second electrode; and a switch for controlling luminescence operation in said electroluminescence element, wherein both of said first electrode and said emissive layer are formed for each of said pixels, said emissive layer contains an emissive material for one of red, green and blue colors, and each electroluminescence element directly emits one of said colors, and wherein said second electrode, and said charge-transport layer having a higher resistance compared to said second electrode and said first electrode, are formed so as to be shared by a plurality of pixels, and wherein said emissive layers of adjacent pixels do not contact one another.

* * * * *